(12) United States Patent
Lopez et al.

(10) Patent No.: US 11,817,375 B2
(45) Date of Patent: Nov. 14, 2023

(54) HIGH I/O DENSITY FLIP-CHIP QFN

(71) Applicant: Texas Instruments Incorporated, Dallas, TX (US)

(72) Inventors: Osvaldo Jorge Lopez, Annandale, NJ (US); Tianyi Luo, Bethlehem, PA (US); Jonathan Almeria Noquil, Bethlehem, PA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 693 days.

(21) Appl. No.: 16/274,562

(22) Filed: Feb. 13, 2019

(65) Prior Publication Data

US 2020/0258822 A1 Aug. 13, 2020

(51) Int. Cl.
*H01L 23/49* (2006.01)
*H01L 23/495* (2006.01)
*H01L 23/31* (2006.01)
*H01L 21/48* (2006.01)
*H01L 21/56* (2006.01)

(52) U.S. Cl.
CPC .... *H01L 23/49541* (2013.01); *H01L 21/4828* (2013.01); *H01L 21/56* (2013.01); *H01L 23/3135* (2013.01); *H01L 23/49582* (2013.01)

(58) Field of Classification Search
CPC ............... H01L 23/49541; H01L 21/56; H01L 23/49582; H01L 21/4828; H01L 23/3135; H01L 2224/16245; H01L 2924/181; H01L 23/49548; H01L 23/49861
See application file for complete search history.

(56) References Cited

U.S. PATENT DOCUMENTS

| | | | | |
|---|---|---|---|---|
| 6,123,552 A * | 9/2000 | Sakata | ................. | H05K 7/1061 439/71 |
| 6,617,197 B1 * | 9/2003 | Bayan | ............... | H01L 23/49541 438/123 |
| 3,049,312 A1 | 11/2011 | Herbsommer et al. | | |
| 8,049,312 B2 * | 11/2011 | Herbsommer | .... | H01L 23/49562 257/713 |
| 9,219,025 B1 * | 12/2015 | Lee | ..................... | H01L 23/3135 |
| 2008/0137700 A1 * | 6/2008 | Yamamoto | .......... | H01S 5/02212 438/26 |
| 2011/0068463 A1 * | 3/2011 | Camacho | .......... | H01L 23/49541 257/713 |
| 2011/0074007 A1 * | 3/2011 | Lopez | ..................... | H01L 24/34 257/692 |
| 2013/0049077 A1 * | 2/2013 | Herbsommer | .... | H01L 23/49524 257/676 |
| 2018/0218968 A1 * | 8/2018 | Sato | ........................ | H01L 24/85 |

* cited by examiner

*Primary Examiner* — S M Sohel Imtiaz

(74) *Attorney, Agent, or Firm* — Ronald O. Neerings; Frank D. Cimino

(57) ABSTRACT

A method of making a semiconductor device includes separating a conductive structure of a leadframe into interior conductive leads using an etching process. The method includes forming a first molded structure by applying a first molding compound to a leadframe having a conductive structure, separating the conductive structure into at least two interior contact portions, attaching a semiconductor die to at least one of the interior contact portions, the at least two interior contact portions being supported by the first molding compound, and forming a second molded structure by applying a second molding compound to at least part of the semiconductor die and at least two interior contact portions.

24 Claims, 8 Drawing Sheets

HIGH I/O DENSITY FLIP-CHIP QFN

BACKGROUND

One type of IC chip package is a quad flat no-lead (QFN) package. This surface mount chip package includes one or more semiconductor dies encapsulated in a package structure, and perimeter leads on the bottom and/or sides thereof for connecting the die or dies to contacts on an associated circuit board or other component.

Input/Output (I/O) lead density of existing QFN devices is limited by lead pitch size and package perimeter. As device functionality increases, the demand for a larger number of I/O leads increases. For conventional QFN packages, this demand for devices with higher I/O pin counts is typically met by larger packages, which increase the package perimeter and increase cost.

SUMMARY

Aspects of the disclosure provide a high density flip-chip QFN and method of making the same. In one example, a method of making a high density flip-chip QFN package includes separating a conductive structure of a leadframe into interior conductive leads using an etching process. The method includes forming a first molded structure by applying a first molding compound to a leadframe having at least one conductive structure, separating the at least one conductive structure into at least two interior contact portions, attaching a semiconductor die to at least one of the interior contact portions, the at least two interior contact portions being supported by the first molding compound, and forming a second molded structure by applying a second molding compound to at least part of the semiconductor die and at least two interior contact portions.

Described examples include a semiconductor device comprising a leadframe having at least one perimeter contact and at least two interior contact portions, a first molding compound having a thickness corresponding to a thickness of the leadframe, a semiconductor die mounted to the leadframe, and a second molding compound encapsulating the semiconductor die and at least a portion of the at least one perimeter contact.

DETAILED DESCRIPTION

Figure 1:
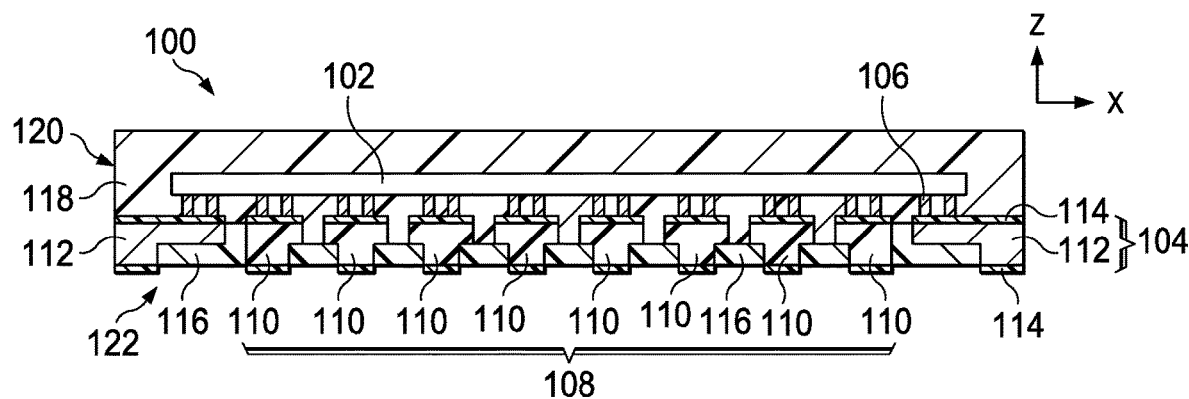
FIG. 1 is a cross-sectional view of an example semiconductor device in accordance with the present disclosure taken along the line 1-1 in FIG. 2

In the drawings, like reference numerals refer to like elements throughout, and the various features are not necessarily drawn to scale. In the following discussion and in the claims, the terms "including", "includes", "having", "has", "with", or variants thereof are intended to be inclusive in a manner similar to the term "comprising", and thus should be interpreted to mean "including, but not limited to . . . ." Also, the term "couple" or "couples" is intended to include indirect or direct electrical or mechanical connection or combinations thereof. For example, if a first device couples to or is coupled with a second device, that connection may be through a direct electrical connection, or through an indirect electrical connection via one or more intervening devices and connections. The various features of the disclosed examples can be used in connection with a variety of different semiconductor devices, including without limitation integrated circuits having multiple electronic components, as well as single component semiconductor devices (e.g., single transistor products, single diode products, etc.).

Figure 2:
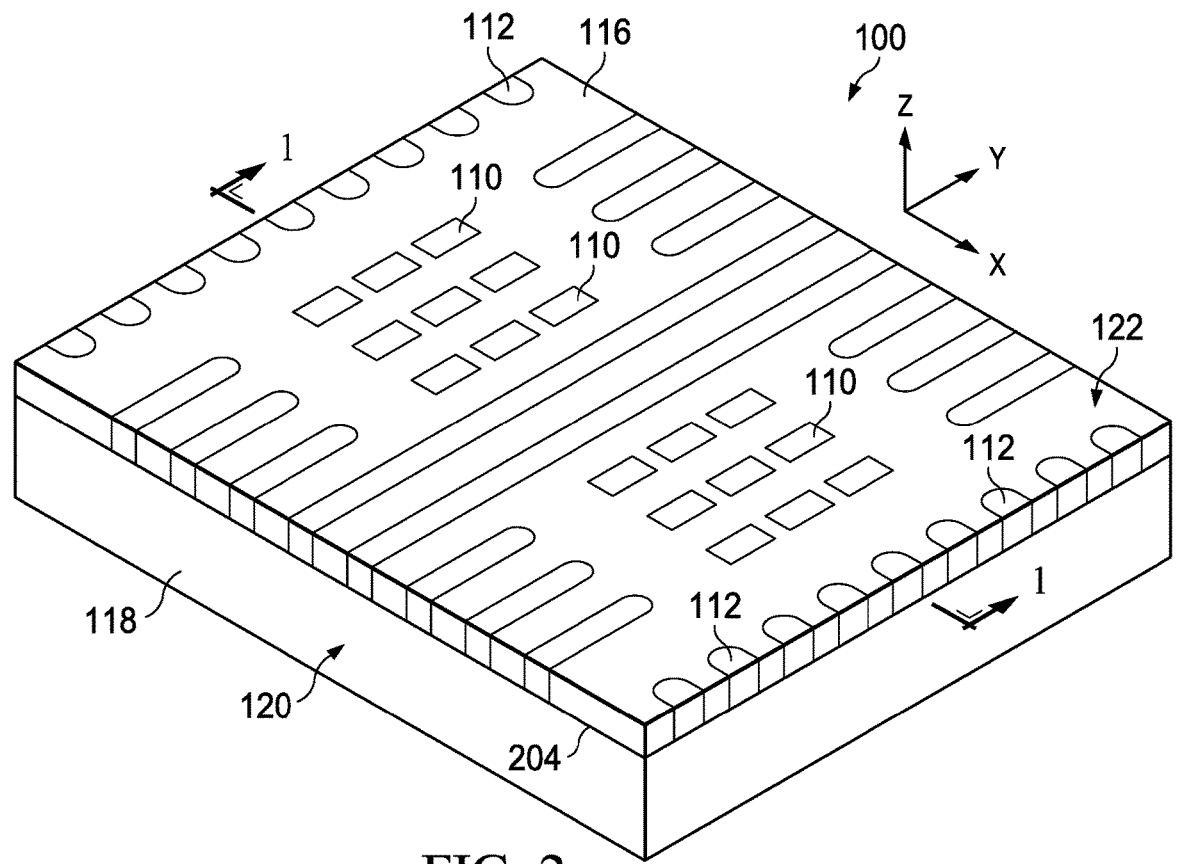
FIG. 2 is a perspective bottom view of the device of FIG. 1

Referring initially to FIGS. 1-2, an example semiconductor device 100 includes a semiconductor die 102 mounted on a leadframe 104 via solder balls 106, or other electrical/mechanical connections as appropriate. The leadframe 104 includes an interior conductive structure 108 separated into multiple interior contact portions 110 and perimeter contacts 112. Upper and lower surfaces of each of the interior contact portions 110 and perimeter contacts 112 include a plating layer 114. An enclosure is formed by a first molding compound 116 and a second molding compound 118. The enclosure encapsulates the semiconductor die 102 and at least a portion of the perimeter contacts 112 and at least a portion of the interior contact portions 110. A portion of each perimeter contact 112 is exposed to a side surface 120 of the device 100 as well as a bottom surface 122 of the device 100. Each interior contact portion 110 is exposed to the bottom surface 122 of the device 100.

The first and second molding compounds 116 and 118 may be the same material, but are applied during different steps of construction of the semiconductor device 100. In some examples, application of the same material for both the first and second molding compounds can result is a transition line 204 being visible on the side surface 120 of the semiconductor device 100. In examples where different materials are used for the first and second molding compounds the transition line 204 may be more pronounced. In either case, a cross-sectional thickness of the first molding compound 116 generally corresponds to the cross-sectional thickness of the leadframe 104.

As shown in FIG. 2, an interior region of the bottom surface 122 includes a number of interior contact portions 110. The interior contact portions 110 are formed through a process in which the conductive structure 108 of the leadframe 104 is supported by the first molding compound 116. In this process, the interior contact portions 110 are separated into individual interior contact portions 110 via etching prior to attaching the semiconductor die 102, and prior to forming an enclosure with the second molding compound 118 in a second molding step. This example processing results in a QFN packaged semiconductor device with a high I/O density.

Figure 3:
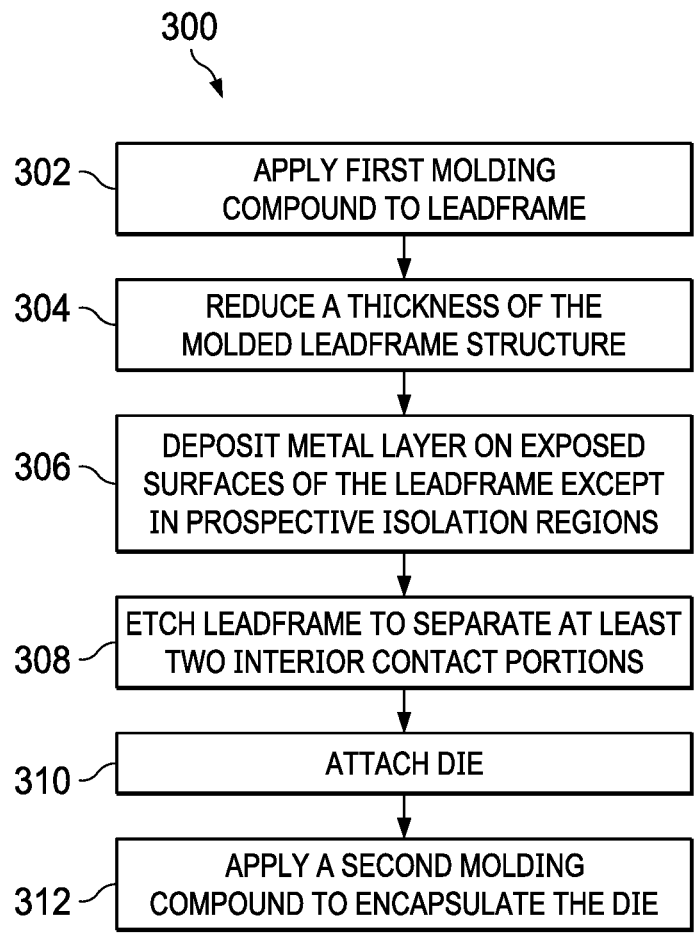
FIG. 3 is a flow diagram showing a method for making a semiconductor device in accordance with the present disclosure.
Figure 5:
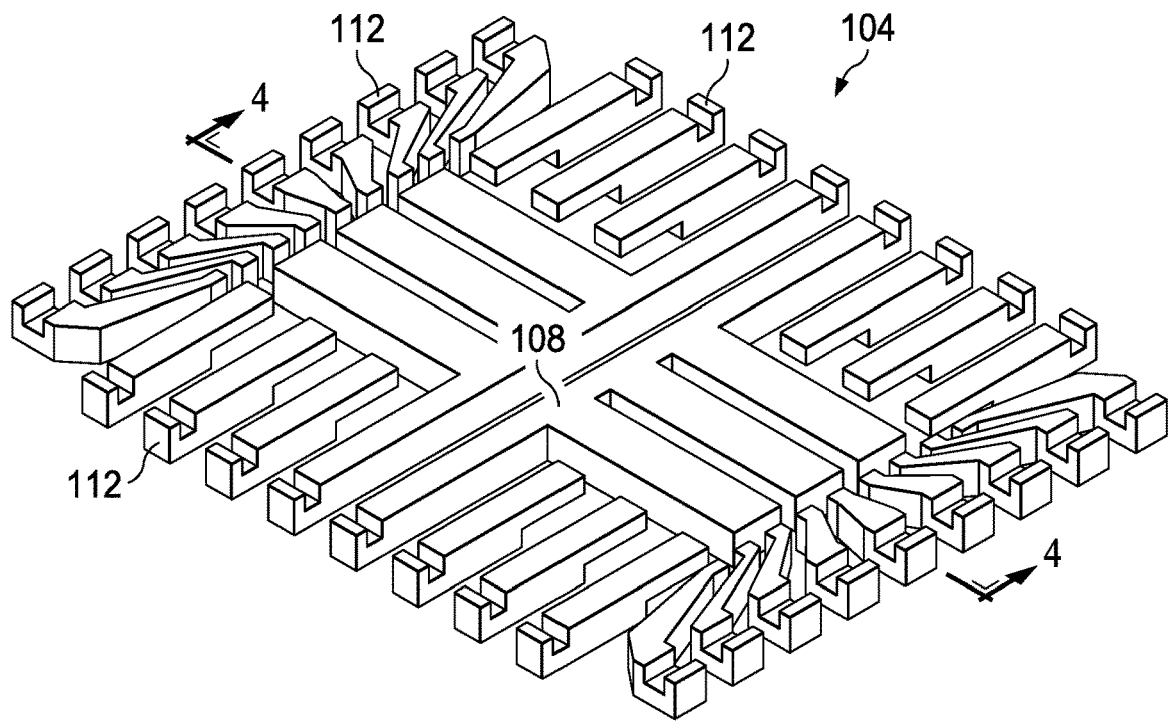
FIG. 5 is a perspective view of a top surface of the structure of FIG. 4.
Figure 6:
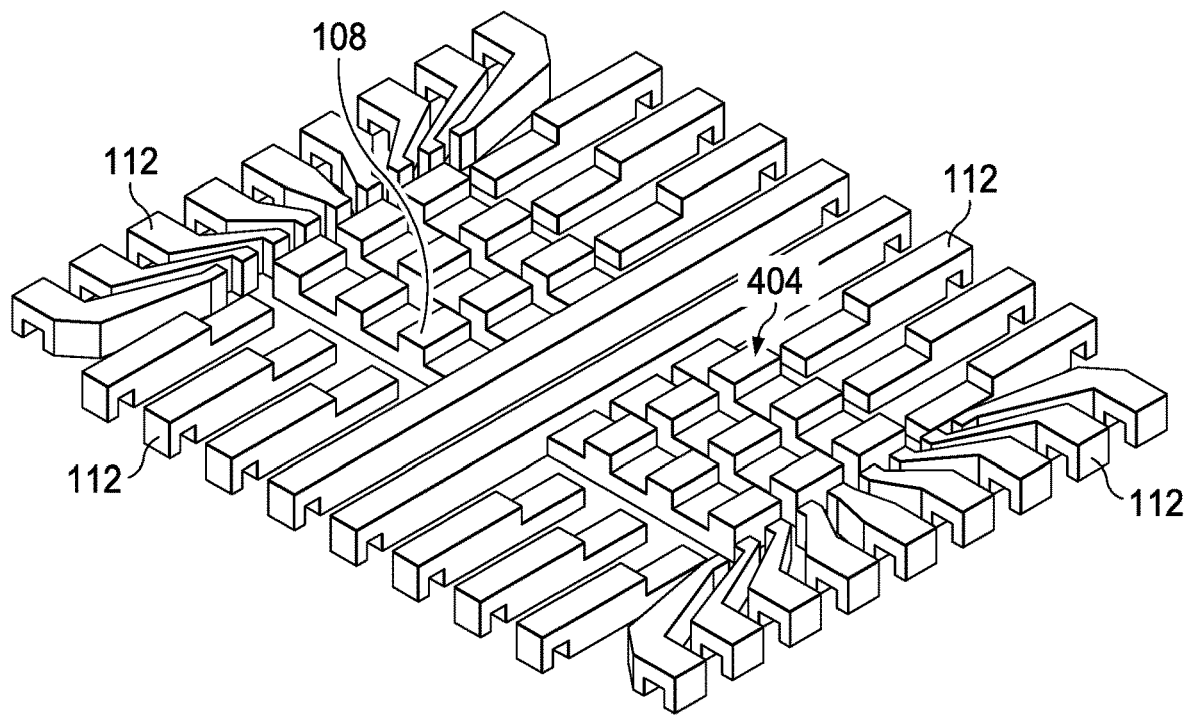
FIG. 6 is a perspective view of a bottom surface of the structure of FIG. 4.

FIG. 3 shows an example method 300 for fabricating a semiconductor device according to an aspect of the present disclosure. The method 300 is illustrated and described below in the context of fabricating the example device 100. The example method 300 begins at 302, where a leadframe structure 104 is provided. FIGS. 5 and 6 show one suitable example of a starting lead frame 104 made through stamping or other suitable fabrication processes using a suitable conductive material, such as copper. The example leadframe structure 104 includes one or more conductive structures 108 as well as perimeter contacts 112. The first molding compound 116 is applied to the leadframe 104. The first molding compound 116 supports the conductive structure 108 and perimeter contacts 112 of the leadframe 104. The first molding compound can be any suitable material, such as epoxy, resin, or the like, and may be the same or different material as the second molding compound 118.

In one example at 304 in FIG. 3, the leadframe 104 and first molding compound 116 are reduced in thickness by removing material therefrom, for example through a grinding process. In another example, the removal processing at 304 is omitted. In implementations that use the removal processing at 304, the grinding facilitates reduced time required to separate the conductive structure 108 into individual interior contact portions 110, and helps provide a roughened or textured surface for subsequent application of the second molding compound 118.

At 306 in FIG. 3, a metal layer is deposited on the exposed upper and lower surfaces of the perimeter contacts 112 and of the interior contact portions 110. In one example, the metal layer deposition includes performing a plating process that deposits metal except in prospective isolation regions of the conductive structure 108.

At 308, material of the conductive structure 108 is removed from the conductive structure 108 at the prospective isolation regions to separate the conductive structure 108 into the interior contact portions 110. In one example, the removal at 308 includes performing an etching process that selectively removes material of the conductive structure 108, and not the plating layer 114 and/or the first molding compound 116. The example etching process at 308 uses an example etchant that is selective so that significantly more material is removed from the exposed prospective isolation regions of the conductive structure 108 than is removed from the plated metal deposited at 306. In this example, the plating layer 114 and the etch chemistry are selected to provide suitable at selectivity such that the processing at 308 selectively removes the material of the conductive structure 108 without removing significant amounts of the plating layer 114, and without removing significant amounts of the first molding compound 116. In some examples, the conductive material connecting two or more interior contact portions 110 can be left in place thereby resulting in a larger interior contact for certain applications (e.g., greater heat distribution, etc.). In such examples, two or more interior contact portions 110, and the conductive material connecting them, are considered to be a larger interior contact.

At 310, the semiconductor die 102 is attached to one or more of the perimeter contacts 112 and/or one or more of the interior contact portions 110. In one example, the electrical coupling can be by wirebonding, flipchip soldering, or any other suitable manner of electrically connecting the semiconductor die 102 with the preformed contacts.

At 312, the second molding compound 118 is applied over at least a portion of the semiconductor die 102, perimeter contacts 112 and/or interior contact portions 110 to enclose the semiconductor die 102.

Figure 4:
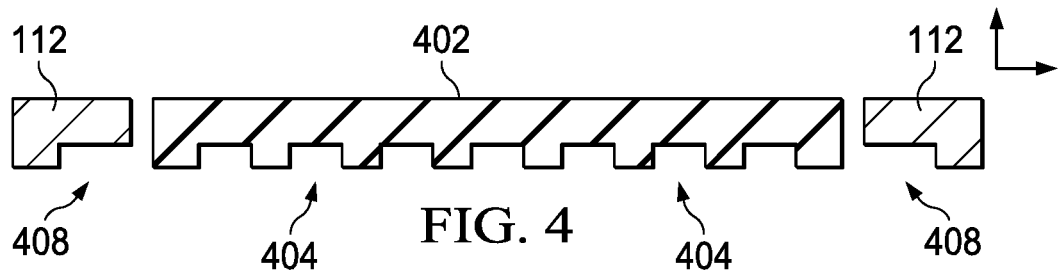
FIG. 4 is cross-sectional view of a leadframe in accordance with the present disclosure taken along the line 4-4 in FIG. 5.

FIGS. 4-15 show the various stages of forming the device 100. In FIGS. 4-6, the leadframe 104 is shown prior to processing. The leadframe 104 in this example is a half-etched leadframe including conductive structures 108 and perimeter contacts 112. As best seen in FIGS. 5 and 6, the leadframe can include a number of conductive structures 108. Although three conductive structures 108 are illustrated, any desired number of conductive structures 108 can be processed in accordance aspects of the described examples. The conductive structures 108 include prospective isolation regions 402 between interior contact portions 110. The prospective isolation portions 402 are reduced cross-sectional thickness portions of the conductive structure 108 formed by respective trenches 404. In one example, the prospective isolation regions 402 are removed to separate the originally half-etched interior contact portions 110. Although each conductive structure 108 of the described example has four prospective isolation regions 402, any number of isolation regions 402 can be provided in other implementations. Interstitial spaces 408 separate the perimeter contacts 112 and conductive structures 108.

Figure 7:
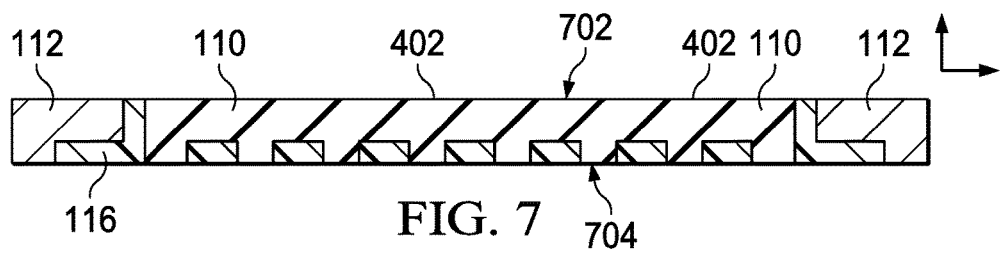
FIG. 7 is a cross-sectional view of a first molded structure including the leadframe of FIGS. 4-6 taken along the line 7-7 in FIG. 8.
Figure 8:
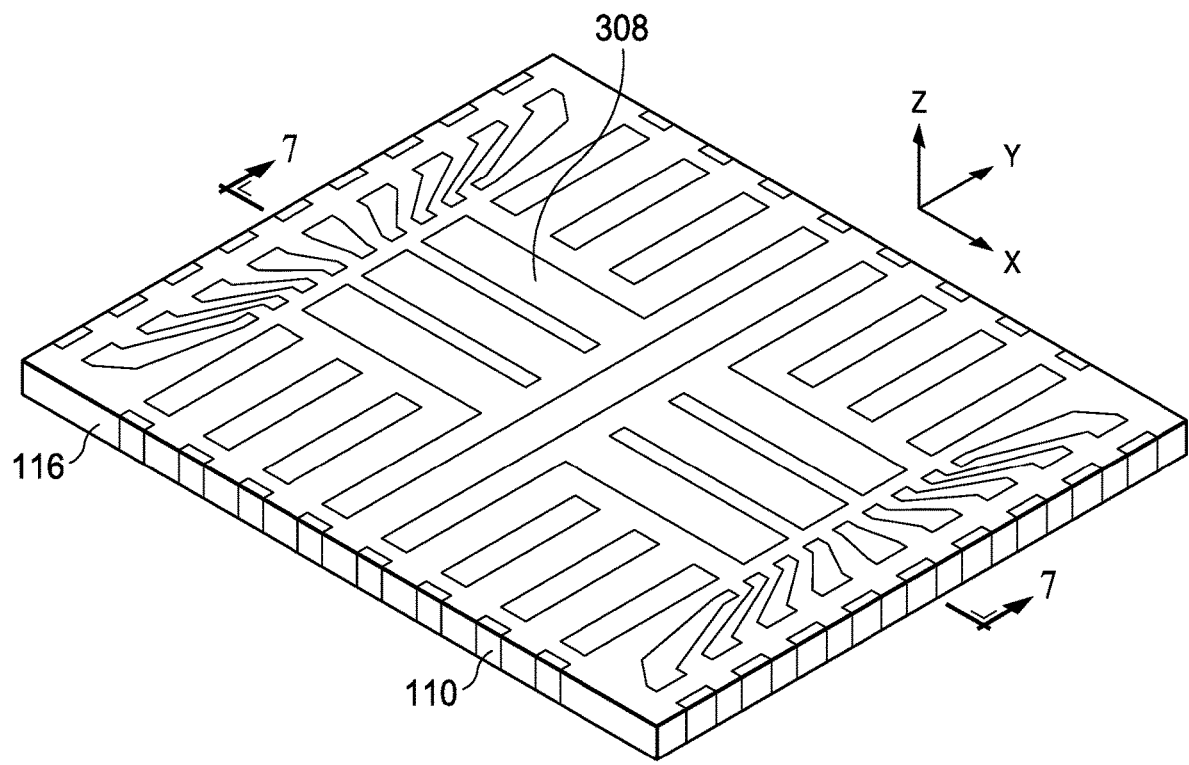
FIG. 8 is a perspective view of a top surface of the structure of FIG. 7.
Figure 9:
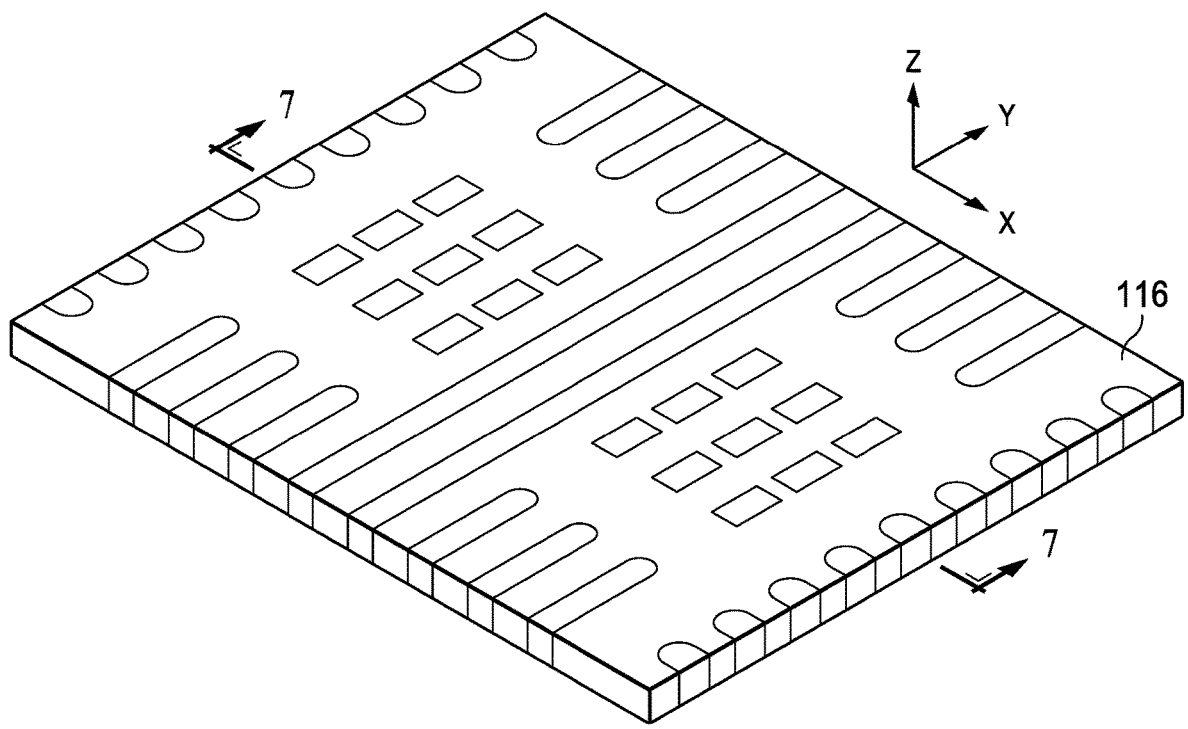
FIG. 9 is a perspective view of a bottom surface of the structure of FIG. 7.

FIGS. 7-9 show the leadframe 104 after the first molding compound 116 is applied (e.g., at 302 in FIG. 3). The resulting structure has generally planar upper and lower surfaces 702 and 704, with the molding compound 116 filling any voids (e.g., interstitial spaces 408) and/or trenches 404 in the leadframe 104. This results in relatively flat upper and lower surfaces 702 and 704 in the illustrated example.

Figure 10:
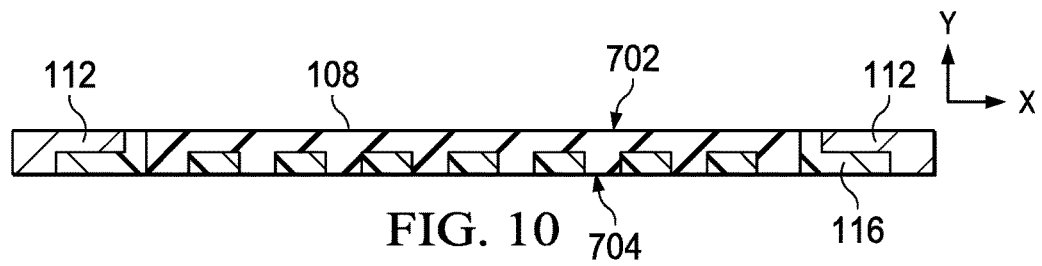
FIG. 10 is a cross-sectional view of the first molded structure of FIG. 7 after material has been removed from a top surface.

FIG. 10 shows the structure of FIGS. 7-9 after material has been removed from the upper surface 702 (e.g., at 304 in FIG. 3). In one example, the material removal is performed by grinding the top surface 702 to reduce a cross-sectional thickness of the structure. In one example, an abrasive drum wheel is used to remove material from the top surface 702. The use of a grinding wheel or drum roughens the leadframe surfaces for better mold compound adhesion. In one example, a grinding wheel roughness of 6000 or 8000 roughness grade is used. Other tools exist for removing material. In one example, the starting thickness of the structure of FIGS. 7-9 is around 8 mil, and 2-3 mil of material is removed at 304, resulting in a final thickness after grinding of 5-6 mil. By reducing the thickness of the leadframe 104 and, in particular, the thickness of the prospective isolation regions 402, subsequent etching to separate the interior contact portions 110 can be executed more quickly than would otherwise be the case if the material removal at 304 is not performed. As a result, implementations that include the material removal at 304 provide advantages with respect to manufacturing cost and time.

Figure 11:
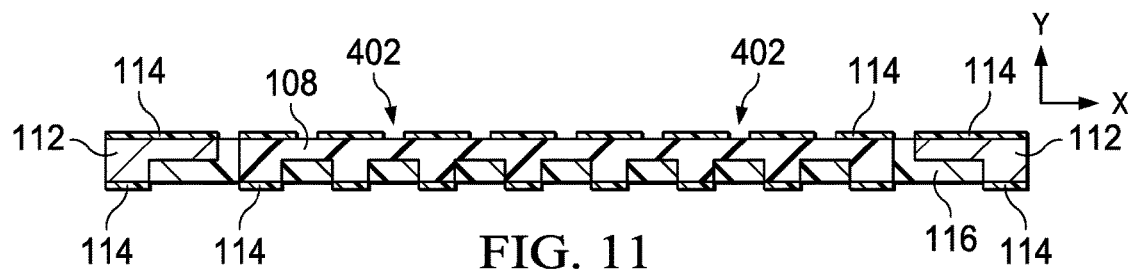
FIG. 11 is a cross-sectional view of the first molded structure of FIG. 10 after plating taken along the line 11-11 in FIG. 12.
Figure 12:
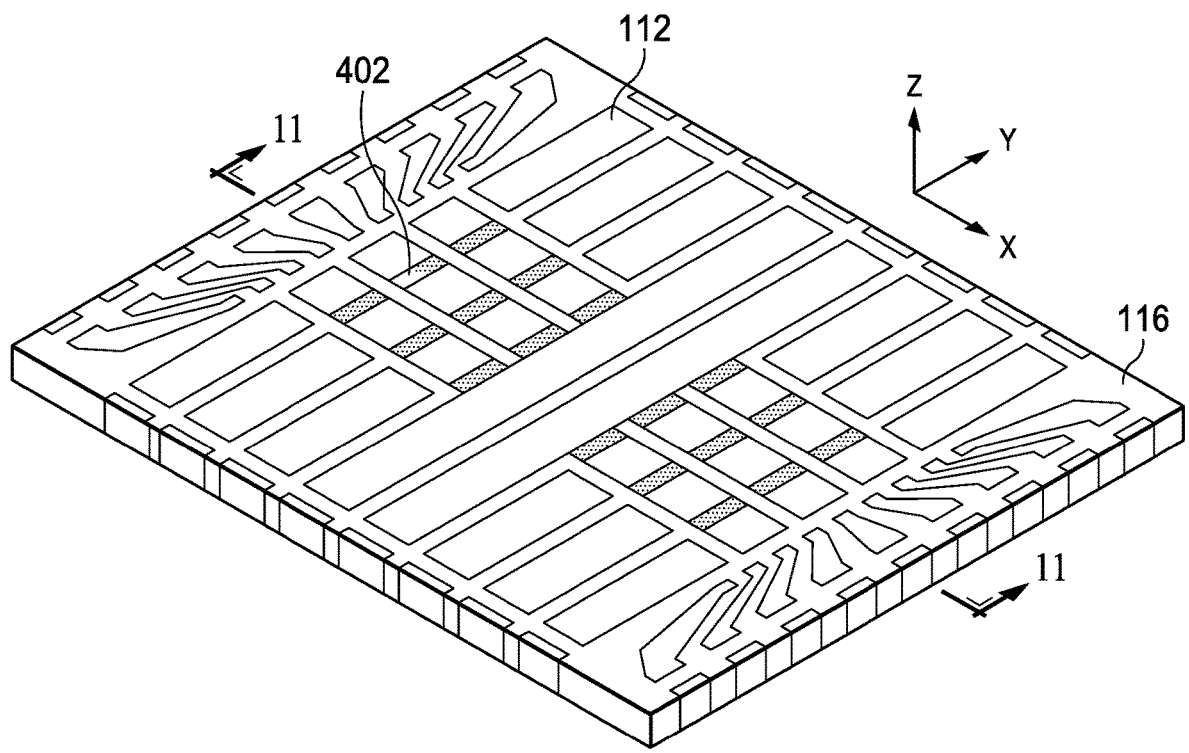
FIG. 12 is a perspective view of a top surface of the structure of FIG. 11.

FIGS. 11 and 12 show the structure of FIG. 10 after the plating layer 114 has been applied to the perimeter contacts 112 and the interior contact portions 110 of the conductive structures 108 (e.g., at 306 in FIG. 3). In this example, the plating layer 114 is selectively applied to the conductive structures 108 only at the interior contact portions 110, leaving the prospective isolation portions 402 unplated (e.g., exposed). In one example, the plating layer 114 is selectively applied through a process that includes applying a seed layer (e.g., of similar material to the subsequently plated material) to the conductive structures 108 and/or perimeter contacts 112 in the areas to be plated, and then plating the structure whereby the plating material bonds selectively to the conductive structures 108 in the regions having the seed layer. Other methods of selectively applying the plating layer 114 can also be used. In certain examples, the plating layer 114 includes one or more of nickel, palladium, gold or silver plating, and has a thickness of around 0.1 µm's.

Figure 13:
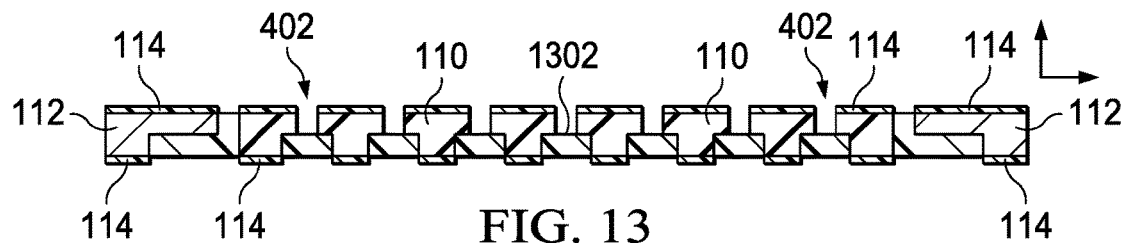
FIG. 13 is a cross-sectional view of the plated first molded structure of FIG. 11 after etching taken along the line 13-13 in FIG. 14.
Figure 14:
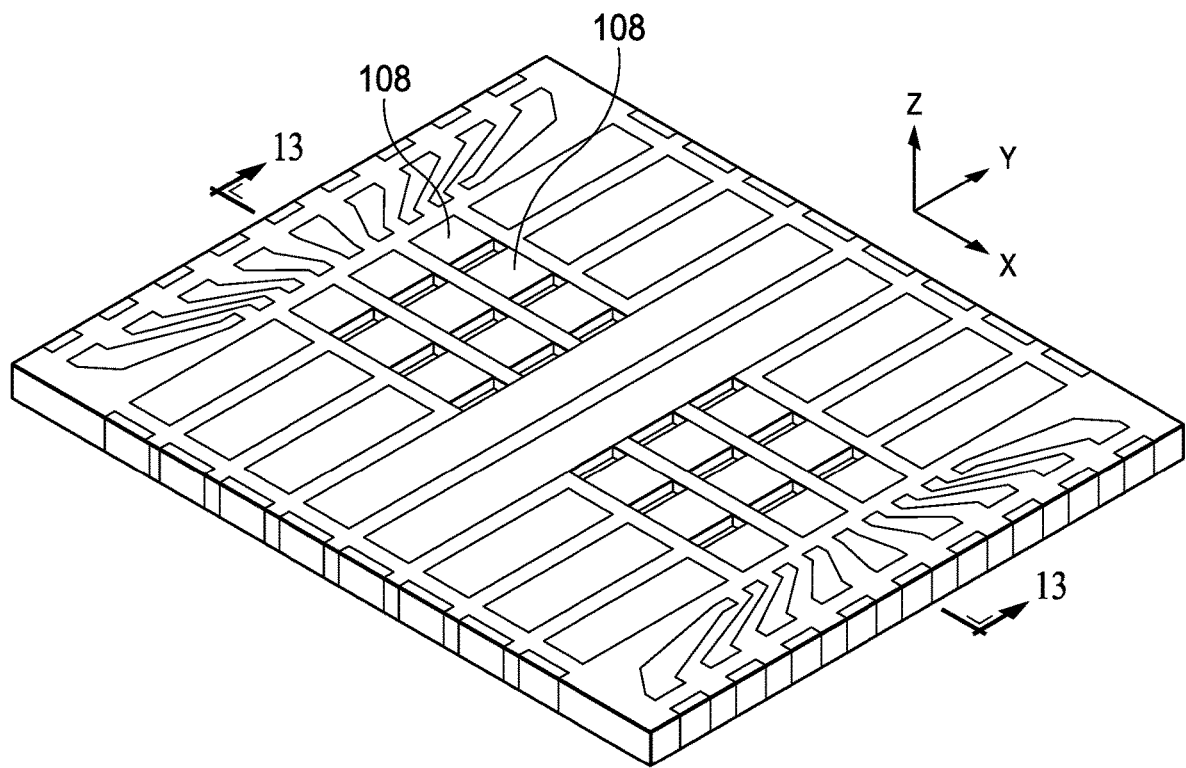
FIG. 14 is a perspective view of a top surface of the structure of FIG. 13.

In FIGS. 13 and 14, the structure of FIGS. 11 and 12 is etched to remove conductive material from the conductive structure 108 at the prospective isolation regions 402. This separates the interior contact portions 110. In this process, the plating layer 114 acts as a mask (e.g., at 308 in FIG. 3). In an example where the conductive structures are copper, one suitable etchant chemical is Hydrated Ferric Chloride. In general, the etchant operates to remove conductive material in the prospective isolation regions 402 of the conductive structures 108, and to create an interstitial space 1302 between adjacent interior contact portions 110, while leaving the plating layer 114 and the first molding compound intact. As such, the patterned plating layer 114 acts as an etch mask during the example etching process at 308.

Figure 15:
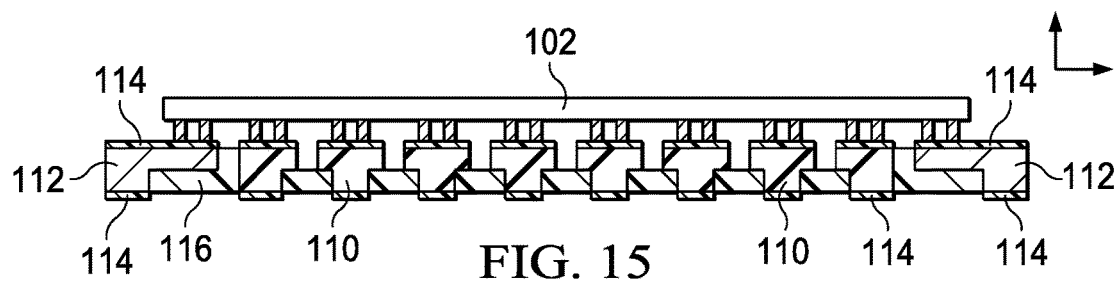
FIG. 15 is a cross-sectional view of the plated first molded structure after etching with a semiconductor die mounted thereto, taken along the line 15-15 in FIG. 16.
Figure 16:
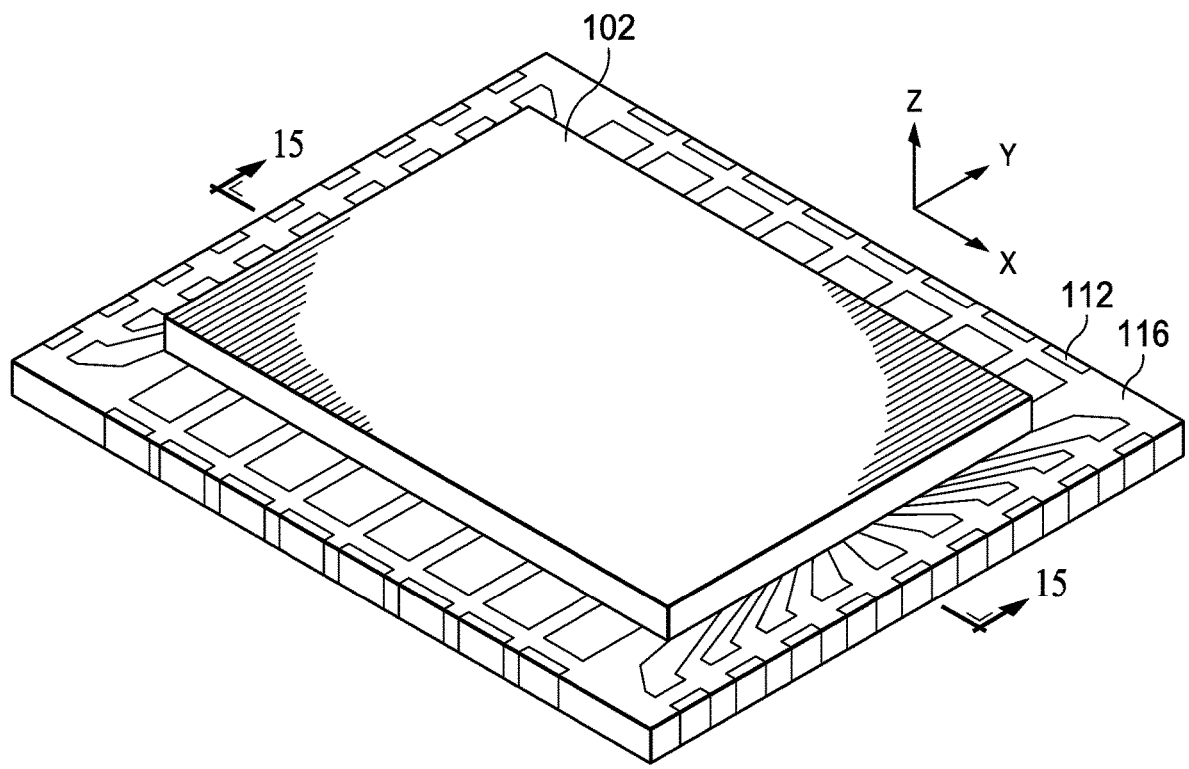
FIG. 16 is a perspective view of a top surface of the structure of FIG. 15.

In FIGS. 15 and 16, the semiconductor die 102 is mounted to the plated and isolated interior contact portions 110 and perimeter contacts 112 of the structure of FIGS. 12 and 13. The semiconductor die 102 can be mounted in accordance with any suitable approach, such as reflowing solder balls originally formed on the semiconductor die 102, soldering copper pillar or post structures originally formed on the die 102 to associated contact portions 110 and perimeter contacts 112, etc.

An enclosure is formed by the second molding compound 118 that is applied over the structure of FIGS. 15 and 16 and encapsulates the semiconductor die 202, at least a portion of the perimeter contacts 112 and at least a portion of the interior contact portions 110 of the conductive structures 18, as shown in the completed device 100 of FIGS. 1 and 2. The second molding material 118 also occupies the interstitial space 1302 between adjacent interior contact portions 108.

While the foregoing description refers to an etching process for removing material from the conductive structures 108 to form individual interior contact portions 110, other processes can be used for removing such material. In some example, the material can be removed by laser cutting or saw cutting the conductive structures 108. Other material removal methods can also be used.

Modifications are possible in the described embodiments, and other embodiments are possible, within the scope of the claims.

The invention claimed is:

1. A semiconductor device, comprising:
a leadframe having a perimeter contact and at least two interior contact portions;
a first molding compound in a space between the perimeter contact and at least one of the interior contact portions and having a thickness of, and no greater than, a thickness of the leadframe;
a semiconductor die mounted to the leadframe;
a second molding compound encapsulating the semiconductor die and covering at least a portion of the perimeter contact, the perimeter contact is exposed on at least two surfaces of the semiconductor device.

2. The semiconductor device of claim 1, wherein the first molding compound and the second molding compound are exposed to a common exterior surface of the semiconductor device.

3. The semiconductor device of claim 1, wherein the first molding compound and the second molding compound are different materials.

4. The semiconductor device of claim 1, wherein the first molding compound occupies an interstitial space between the perimeter contact and an interior contact portion.

5. The semiconductor device of claim 4, wherein the second molding compound occupies an interstitial space between adjacent interior contact portions.

6. The semiconductor device of claim 1, wherein the perimeter contact and the at least two interior contact portions include a plating layer.

7. The semiconductor device of claim 6, wherein the plating layer includes nickel, palladium, gold or silver plating.

8. The semiconductor device of claim 6, wherein the plating layer has a thickness of about 0.1 µm.

9. The semiconductor device of claim 1, wherein the two surfaces are orthogonal to each other.

10. A packaged semiconductor device, comprising:
a leadframe, including:
a perimeter contact, and
at least two interior contact portions;
a semiconductor die mounted to the leadframe;
a first molding compound filling a thickness of the leadframe between the perimeter contact and at least one of the interior contact portions and filling a first portion of the thickness of the leadframe between the at least two interior contact portions, wherein the perimeter contact is exposed on at least two surfaces of the packaged semiconductor device; and
a second molding compound that encapsulates the semiconductor die and fills a second portion of the thickness of the leadframe between the at least two interior contact portions.

11. The packaged semiconductor device of claim 10, wherein the first molding compound occupies an interstitial space between the perimeter contact and one of the interior contact portions.

12. The packaged semiconductor device of claim 10, wherein the perimeter contact and the at least two interior contact portions include a plating layer.

13. The packaged semiconductor device of claim 12, wherein the plating layer includes nickel, palladium, gold or silver plating.

14. The packaged semiconductor device of claim 10, wherein the first molding compound and the second molding compound are exposed to a common exterior surface of the packaged semiconductor device.

15. The packaged semiconductor device of claim 10, wherein the two surfaces are orthogonal to each other.

16. A packaged semiconductor device, comprising: a perimeter contact exposed on at least two surfaces of the semiconductor device and at least two interior contact portions exposed on one surface of the semiconductor device; a first molding compound filling a thickness of the leadframe between the perimeter contact and at least one of the interior contact portions and filling a first portion of the thickness of the leadframe between the at least two interior contact portions; a semiconductor die mounted to the perimeter contact and the at least two interior contact portions; and a second molding compound covering the semiconductor die and a second portion of the thickness of the leadframe between the at least two interior contact portions.

17. The packaged semiconductor device of claim 16, wherein the molding compound occupies an interstitial space between the perimeter contact and an interior contact portion.

18. The packaged semiconductor device of claim 16, wherein the molding compound occupies an interstitial space between adjacent interior contact portions.

19. The packaged semiconductor device of claim 17, wherein the molding compound further occupies an interstitial space between adjacent interior contact portions.

20. The packaged semiconductor device of claim 16, wherein the perimeter contact and the at least two interior contact portions include a plating layer.

21. The packaged semiconductor device of claim 20, wherein the plating layer includes nickel, palladium, gold or silver plating.

22. The packaged semiconductor device of claim 20, wherein the plating layer has a thickness of about 0.1 µm.

23. The packaged semiconductor device of claim 16, wherein the two surfaces are orthogonal to each other.

24. A packaged semiconductor device, comprising:

a leadframe including a perimeter contact and at least two interior contact portions, wherein the perimeter contact is exposed on at least two surfaces of the packaged semiconductor device, the two surfaces being orthogonal to each other;

a first molding compound filling a thickness of the leadframe between the perimeter contact and at least one of the interior contact portions;

a semiconductor die mounted to the leadframe; and a second molding compound covering the semiconductor die, a top surface of the perimeter contact, a top surface of the first molding compound and at least a top surface of the at least two interior contact portions.

* * * * *